United States Patent [19]
Gross, Jr. et al.

[11] Patent Number: 5,627,496
[45] Date of Patent: May 6, 1997

[54] PLL AND PHASE DETECTION CIRCUIT THEREFOR

[75] Inventors: George F. Gross, Jr., Reading, Pa.; Thayamkulangara R. Viswanathan, Addison, Tex.

[73] Assignee: Lucent Technologies Inc., Murray Hill, N.J.

[21] Appl. No.: 664,655

[22] Filed: Jun. 17, 1996

Related U.S. Application Data

[60] Provisional application No. 60/000,386 6/21/95.
[51] Int. Cl.$^6$ .......................... H03L 7/085; G01R 25/00
[52] U.S. Cl. .................. 331/25; 331/1 A; 331/8; 331/16; 327/3; 327/7; 327/12; 327/159
[58] Field of Search ................. 331/1 A, 8, 16, 331/17, 18, 25; 327/2, 3, 5, 7, 12, 156–159

[56] References Cited

U.S. PATENT DOCUMENTS

| | | | |
|---|---|---|---|
| 3,816,803 | 6/1974 | Gordon | 320/1 |
| 3,988,696 | 10/1976 | Sharpe | 331/1 A |
| 4,077,016 | 2/1978 | Sanders et al. | 331/4 |
| 4,115,745 | 9/1978 | Egan | 331/17 |
| 4,151,463 | 4/1979 | Kibler | 324/82 |
| 4,590,440 | 5/1986 | Haque et al. | 331/17 |
| 4,689,577 | 8/1987 | Vreeken et al. | 327/5 X |
| 4,924,225 | 5/1990 | Dingwall et al. | 341/118 |
| 4,999,633 | 3/1991 | Draxelmayr | 341/120 |
| 5,027,116 | 6/1991 | Armstrong et al. | 341/120 |
| 5,302,916 | 4/1994 | Pritchett | 331/1 A |
| 5,337,022 | 8/1994 | Pritchett | 331/1 A |
| 5,572,167 | 11/1996 | Alder et al. | 331/25 X |

OTHER PUBLICATIONS

"Controlled–Root Approach to Digital Phase–locked Loops" *Electronic Systems, NASA Tech. Briefs*, Apr. 1995, p. 40, Stephens, S.A. et al.
"PLL's Lock Indicator Detects Latching Simply" by Steve Kirby, *Electronics*, Apr. 10, 1980, pp.127–129.
"How Can you be Sure that Your PLL is Really Locked In?" by C. Andrew Sharpe, *EDN*, Feb. 20, 1977, vol.22, No. 4, pp.109–112.

*Primary Examiner*—David Mis
*Attorney, Agent, or Firm*—David L. Smith

[57] ABSTRACT

There is disclosed an integrated circuit including a phase detection circuit having an exclusive gate having first and second gate inputs for receiving first and second gate input signals. The exclusive gate provides at an output, a gate output signal that is the exclusive combination of the first and second gate input signals. A first switched resistance is coupled between a first voltage source and a common node. A second switched resistance, coupled between a second voltage source and the common node, receives the gate output signal of the exclusive gate to control the effective resistance thereof. The first and second resistances develop a signal at the common node. A comparator has a first input coupled to the common node and a second input coupled to a threshold value. The comparator output provides a signal that takes on a first value when the average value of the signal developed at the common node is less than the threshold, and a second value when the average value of the signal developed at the common node is greater than the threshold, with the result that the comparator output signal is indicative of whether the first and second gate input signals are in phase.

15 Claims, 4 Drawing Sheets

PLL AND PHASE DETECTION CIRCUIT THEREFOR

This application claims the benefit of U.S. provisional application Ser. No. 60/000,386, filed Jun. 21, 1995.

TECHNICAL FIELD

This invention relates generally to integrated circuits having a phase detection circuit and in particular to a frequency generator including a phase detection circuit utilizing switched resistors.

BACKGROUND OF THE INVENTION

Phase-locked loops have relied on analog-circuit techniques to provide phase detection and adjustment. Circuits for detecting the phase between an input signal to a phase-locked loop and the feedback signal from the output of the phase-locked loop detect whether the signals are in-phase (aligned) or are out-of-phase (misaligned). Should a phase difference occur, the oscillator is adjusted to reduce the phase difference between the input signal and the output signal.

SUMMARY OF THE INVENTION

In accordance with an embodiment of the invention, an integrated circuit includes a phase detection circuit having an exclusive gate having first and second gate inputs for receiving first and second gate input signals. The exclusive gate provides at an output, a gate output signal that is the exclusive combination of the first and second gate input signals. A first switched resistance is coupled between a first voltage source and a common node. A second switched resistance, coupled between a second voltage source and the common node, receives the gate output signal of the exclusive gate to control the effective resistance thereof. The first and second resistances develop a signal at the common node. A comparator has a first input coupled to the common node and a second input coupled to a threshold value. The comparator output provides a signal that takes on a first value when the average value of the signal developed at the common node is less than the threshold, and a second value when the average value of the signal developed at the common node is greater than the threshold, with the result that the comparator output signal is indicative of whether the first and second gate input signals are in phase.

DETAILED DESCRIPTION

Figure 1:
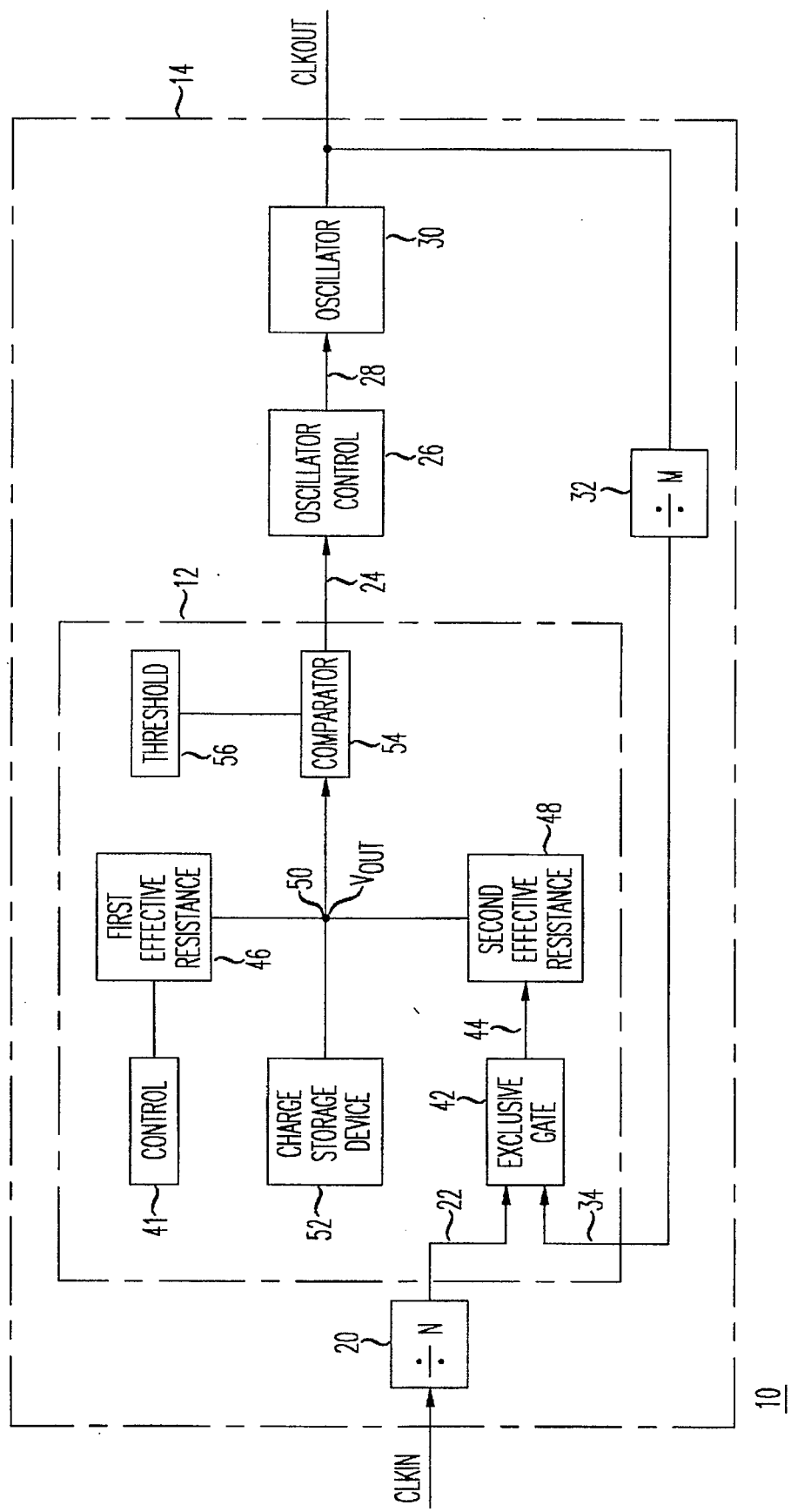
FIG. 1 is a schematic diagram illustrating a phase-locked loop frequency synthesizer, including a phase detection circuit in accordance with the present invention.

A schematic diagram of a frequency generator 10 incorporating phase detection circuit 12 is shown in FIG. 1. Frequency generator 10 includes a frequency synthesizer phase-locked loop circuit 14. Phase-locked loop circuit 14 receives a reference clock signal CLKIN at a first frequency as an input and generates an oscillator clock signal CLKOUT at a second, typically higher, frequency as an output. Phase detection circuit 12 compares the reference clock signal CLKIN and the oscillator clock signal CLKOUT, or divided down versions of these signals, to evaluate whether the reference clock signal CLKIN and the oscillator clock signal CLKOUT are in phase, and thus aligned. Any phase error between the two signals is used to control the oscillator to reduce the phase difference between the signals, thereby bringing the signals into alignment.

The reference clock signal CLKIN is coupled to the input of divide-by-N counter 20. The output 22 of divide-by-N counter 20 is coupled as the first input to phase detection circuit 12. The output 24 from phase detection circuit 12 is coupled as an input to oscillator control circuit 26. The output 28 of oscillator control circuit 26 is coupled as an input to oscillator 30. The output of oscillator 30 is the oscillator clock signal, CLKOUT. The oscillator output is coupled to the clock input of divide-by-M counter 32. By selecting appropriate values of N and M, the output 34 from divide-by-M counter 32 is a signal at the same frequency as output 22 of divide-by-N counter 20. Output 34 from divide-by-M counter 32 is coupled as the second input to phase detection circuit 12.

Output 22 provides a first input to exclusive gate 42 and output 34 provides a second input to exclusive gate 42. The output 44 of exclusive gate 42 is the exclusive combination of the inputs and is coupled as an input to one of the first effective resistance 46 or second effective resistance 48. The other effective resistance is controlled by control 41. Output 44 is shown in FIG. 1 as being coupled as an input to second effective resistance 48 and control 41 is shown coupled as an input to first effective resistance 46. First and second effective resistances 46 and 48 are coupled to a common node 50. A charge storage device 52 may also be coupled to node 50. The voltage developed at node 50, $V_{OUT}$, provides a first input to comparator 54. Threshold 56 provides a second input to comparator 54. The output of comparator 54 is output 24 of phase detection circuit 12.

Figure 2:
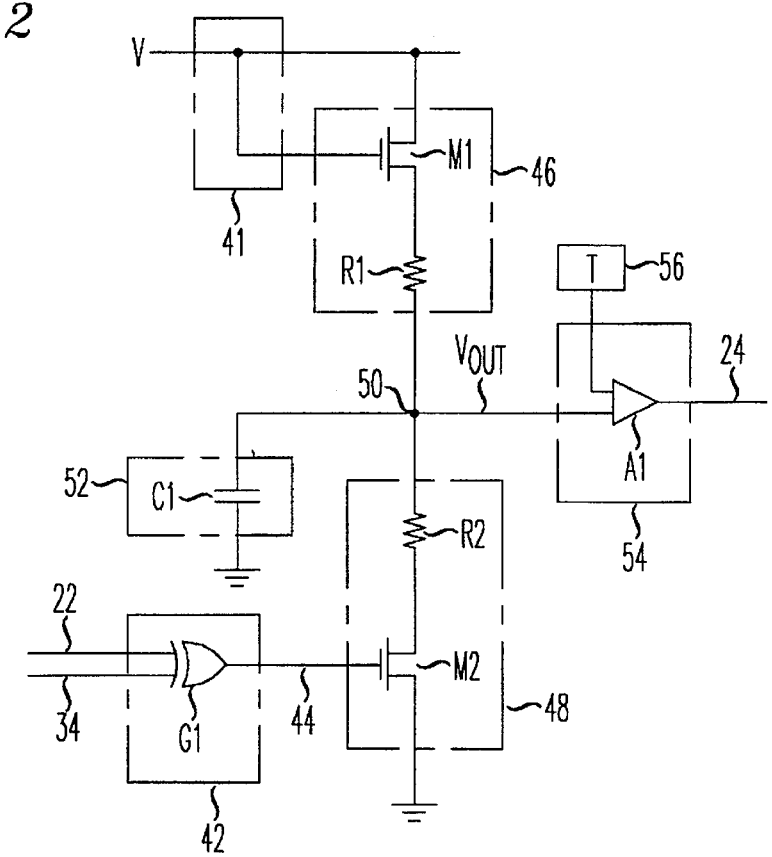
FIG. 2 is a schematic diagram illustrating a particular embodiment of the phase detection circuit.

FIG. 2 illustrates a particular embodiment of the phase detection circuit shown in FIG. 1, employing switched resistance techniques. In FIG. 2, exclusive gate 42 is illustrated as an exclusive OR gate G1, first effective resistance 46 is illustrated as a series coupled transistor M1 and resistor R1 with the series combination coupled between a voltage source V and node 50. Second effective resistance 48 is illustrated as a series coupled transistor M2 and resistor R2 with the series combination coupled between node 50 and ground. Charge storage device 52, illustrated as a capacitor C1, is present when the capacitance of the interconnects does not adequately smooth the voltage fluctuations at node 50. Comparator 54 is illustrated as a differential amplifier A1. Threshold 56 provides an input to differential amplifier A1.

The operation of phase detection circuit 12 will be described with reference also to FIGS. 3–6. Four waveforms are illustrated in each of FIGS. 3–6. They are output 22 from divide-by-N counter 20, output 34 from divide-by-M counter 32, output 44 from exclusive OR gate G1, and the average value of output 44.

Figure 3:
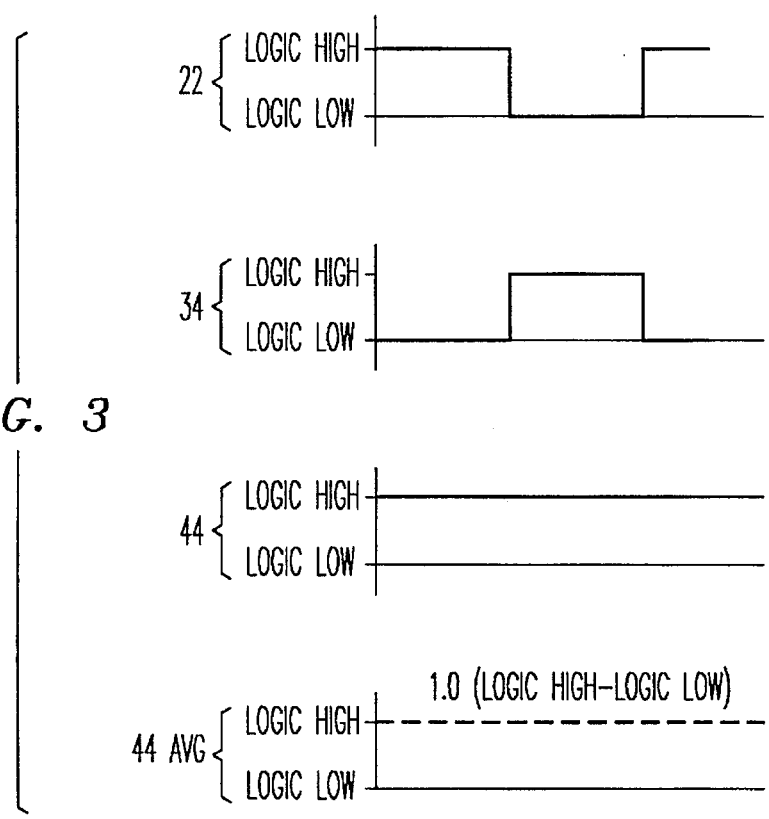
FIG. 3 is a graphical diagram illustrating two signals 180° out-of-phase, the exclusive OR combination of the two signals, and the average value of the exclusive OR combination of the two signals.
Figure 4:
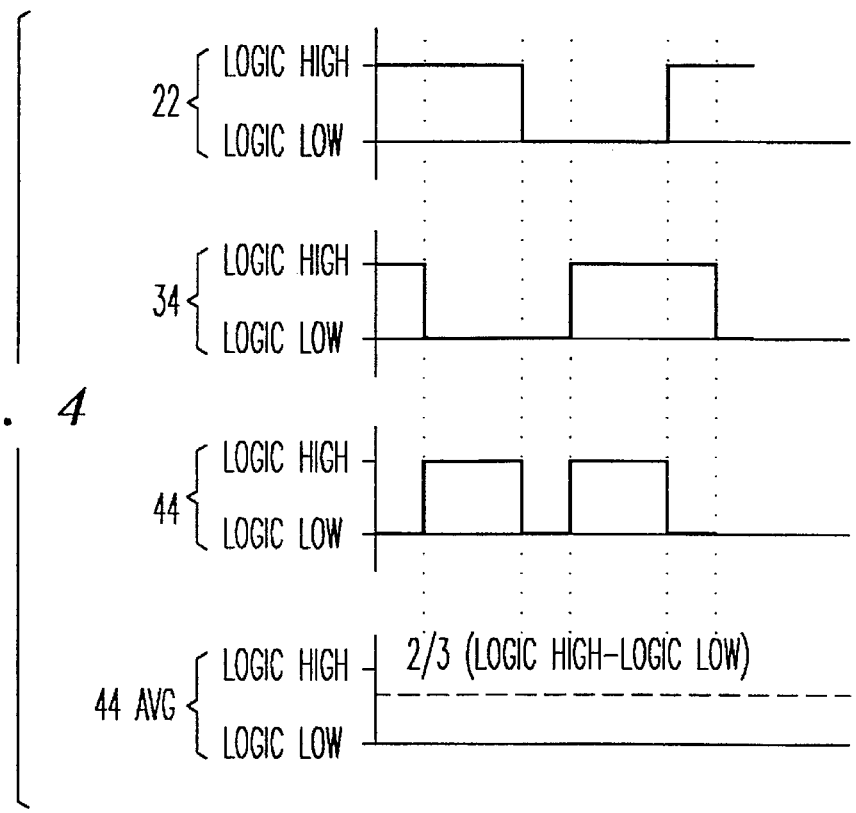
FIG. 4 is a graphical diagram illustrating two signals approximately 120° out-of-phase, the exclusive OR combination of the two signals, and the average value of the exclusive OR combination of the two signals.
Figure 5:
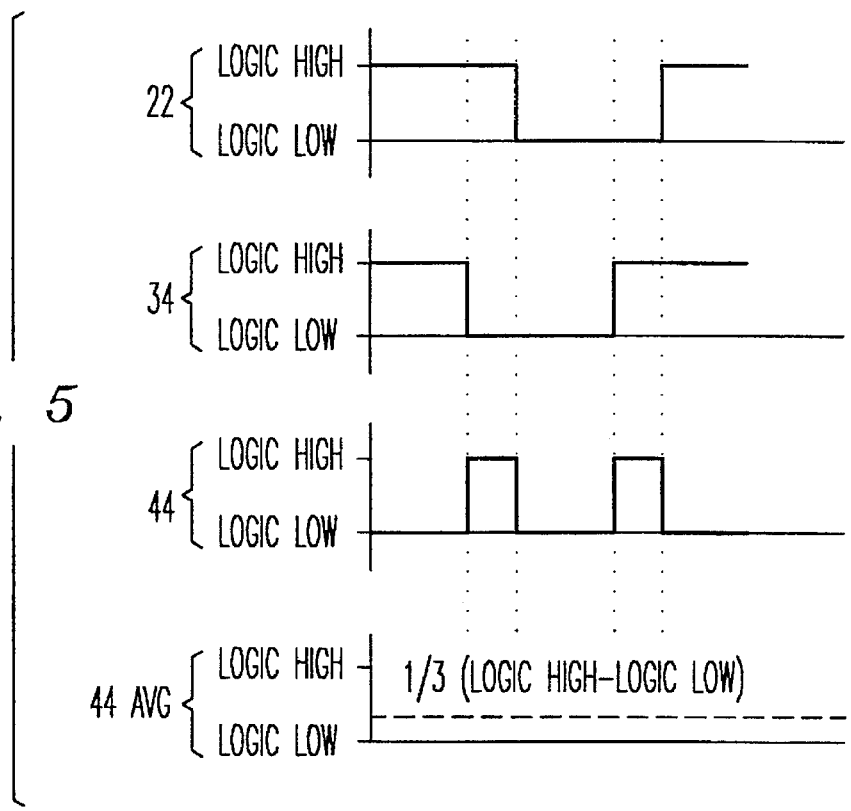
FIG. 5 is a graphical diagram illustrating two signals approximately 60° out-of-phase, the exclusive OR combination of the two signals, and the average value of the exclusive OR combination of the two signals.
Figure 6:
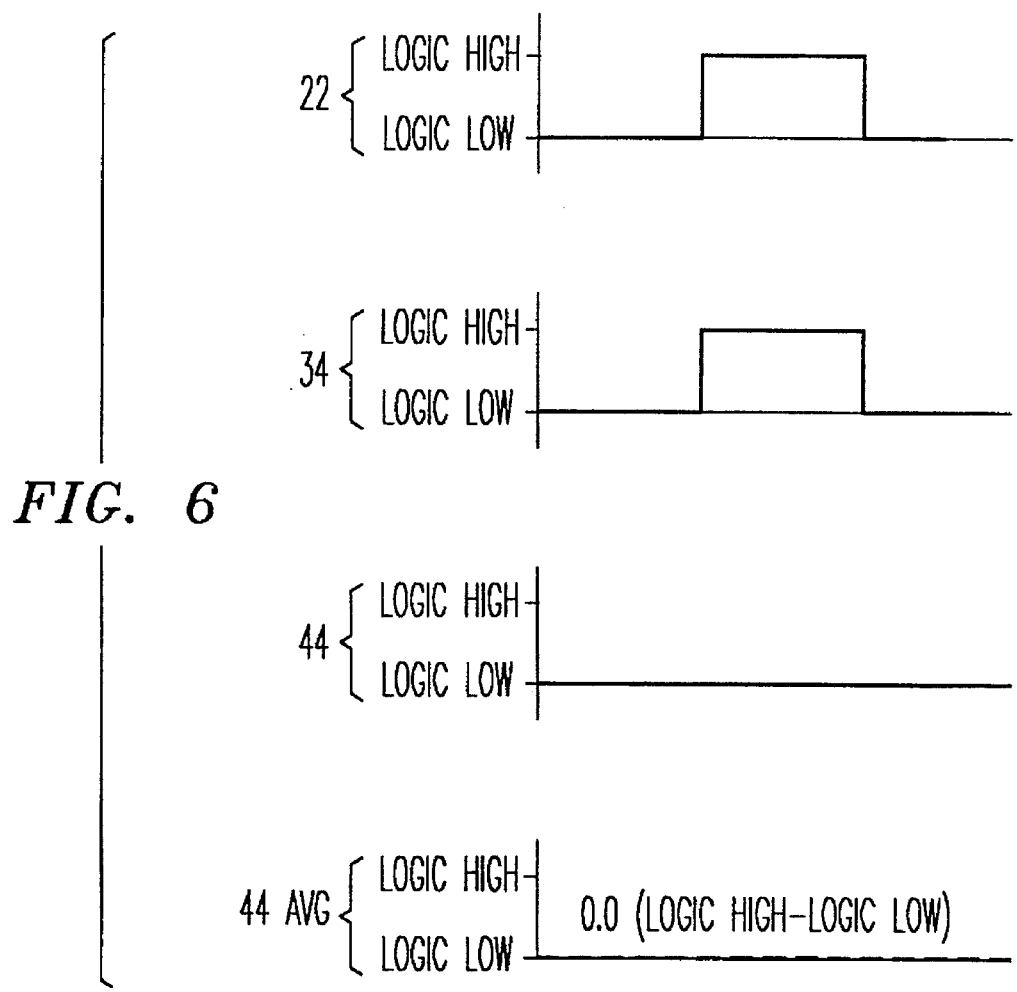
FIG. 6 is a graphical diagram illustrating two signals in-phase, the exclusive OR combination of the two signals, and the average value of the combination of the two signals.

FIGS. 3–6 illustrate that the average value of output 44, $V_{44\;AVG}$, is indicative of the phase difference between output signals 22 and 34. $V_{44\;AVG}$ is maximum when the output signals 22 and 34 are 180° out-of-phase, as shown in FIG. 3. As output signals 22 and 34 become more in-phase, such as approximately 120° out-of-phase as shown in FIG. 4, and approximately 60° out-of-phase as shown in FIG. 5, the average value of output 44 decreases until as shown in FIG. 6, the average value of output 44 equals zero when output signals 22 and 34 are in-phase. Output 44 can be used to control a switched resistance circuit to provide an effective resistance proportional to the time a switch is either opened or closed.

Transistors M1 and M2 function as switches that may be turned on or off to vary, respectively, the magnitude of the effective resistance of first and second effective resistances 46 and 48. One of transistors M1 or M2 can be controlled by output 44 to vary its associated effective resistance. In the embodiments shown in FIGS. 1 and 2, output 44 is illustrated as controlling transistor M2 in the second effective resistance.

Transistor M1 can be controlled by a clock of any known duty cycle from zero through 100%. (In the embodiment illustrated in FIGS. 1 and 2, 0% means transistor M1 is always in the off state and 100% means transistor M1 is always in the on state, but the invention is not limited to these operating conditions.) The on-off state of transistor M2 is controlled by output 44.

The average current that flows through effective resistance 46 is $$I_{AVG} = \left(\frac{V}{R1}\right)\left(\frac{W1}{T1}\right)$$

where:

R1 is the resistance in ohms of resistor R1, and

W1 is the duration transistor M1 is turned on during cycle time

T1., i.e., $$\frac{W1}{T1}$$

represents the duty cycle.

The first effective resistance is $$R1_{EFF} = \frac{V}{I_{AVG}}$$

substituting for $I_{AVG}$ above, the effective resistance becomes $$R1_{EFF} = \frac{V}{\frac{V}{R1}\cdot\frac{W1}{T1}}$$

$$R1_{EFF} = R1\left(\frac{T1}{W1}\right)$$

Similarly, the second effective resistance is $$R2_{EFF} = R2\left(\frac{T2}{W2}\right)$$

where:

R2 is the resistance in ohms of resistor R2,

T2 is the period of of output 34, and

W2 is the duration transistor M2 is turned on.

The output voltage, $V_{OUT}$, developed at node 50 is given by a voltage divider relationship $$V_{OUT} = V\left(\frac{R2_{EFF}}{R1_{EFF} + R2_{EFF}}\right)$$

Effective resistances are used in determining $V_{OUT}$ because the resistances are switched. If either switch has a 100% duty cycle, in effect the switch would be on all of the time and the corresponding effective resistance would equal the resistance of the respective resistor.

To provide insight into the operation of phase detection circuit 12, assume the resistance values of resistors R1 and R2 are equal, and the ratio of T2/W2 is much greater than the ratio of T1/W1. This indicates that as outputs 22 and 34 approach zero phase difference, the output of the exclusive gate tends toward zero, R2 effective approaches infinity, and voltage $V_{OUT}$ approaches V. When outputs 22 and 34 are in-phase, output 44 remains at zero all of the time, with the result that transistor M2 is open all of the time which in turn means that $R2_{EFF}$ is infinite. Concurrently, $R1_{EFF}$ is finite with the result that $V_{OUT}$ tends toward V.

The values of R1 and R2, as well as C1, if present, are selected in accordance with the desired frequency of operation. By choosing appropriate values of R1 and R2, $V_{OUT}$ at node 50 can be made to reach a predetermined threshold at any predetermined phase relationship between signals 22 and 34. In the embodiment shown in FIGS. 1 and 2, the range of $V_{OUT}$ extends from ground potential to V volts while the range of phase extends from 0° to 360°.

Voltage $V_{OUT}$ is provided to comparator 54 which compares $V_{OUT}$ to a predetermined voltage threshold 56. Comparator output 24 directs oscillator control circuit 26 to adjust the phase of CLKOUT to maintain the phase difference between outputs 22 and 34 to within the tolerance of the design.

By way of example, to have comparator 54 change state when outputs 22 and 34 are within 18° of being in phase, with a voltage supply of 5 volts, a comparator threshold of 3 volts, transistor M1 coupled to provide a 100% duty cycle (switched to be on 100% of the time), and resistor R1 selected to be 10,000 ohms. Since 18° is 10% of 180°, transistor M2 will be closed 90% of the time and open 10% of the time. $V_{OUT}$ for the 10% of the time transistor M2 is open, $V_{OUT\;10}$, is V volts. $V_{OUT\;10}$ is 5 volts because with transistor M1 in the on state when transistor M2 is in the off state, no current flows through resistor R1 since the resistance of $R2_{EFF}$ is infinite. 90% of the time when transistor M2 is in the on state, the voltage at $V_{OUT}$, $V_{OUT\;90}$, is determined by a resistor-divider network.

$$V_{OUT90} = \left[V\frac{R2}{(R1+R2)}\right]$$

$$V_{OUT90} = \frac{5R2}{10,000 + R2}$$

Then the weighted average voltage at $V_{OUT}$, and therefore the average input to comparator 54, is $$V_{OUT\;AVG} = 0.1(V_{OUT\;10}) + 0.9(V_{OUT\;90})$$

$$V_{OUT\;AVG} = 0.1[V] + 0.9\left[V\left(\frac{R2}{R1+R2}\right)\right]$$

substituting the known quantities, the desired comparator threshold voltage of 3 volts for $V_{OUT\ AVG}$, 5 volts for V, and 10,000 ohms for resistor R1, the above equation becomes $$3 = 0.1(5) + 0.9 \left[ 5 \left( \frac{R2}{10,000 + R2} \right) \right]$$

Solving for the single unknown quantity, R2, R2 is 12,500 ohms. Providing resistor R2 of 12,500 ohms will cause the comparator to change state when the phase of outputs 22 and 34 are within 18° of each other.

While an illustrative embodiment of the invention has been described as employing an exclusive OR gate and n-channel transistors M1 and M2 as switches, the invention is not limited thereto. For example, but not limited to, the phase detection circuit could include exclusive NOR gate, or p-channel transistors, or both. The values of resistors R1 and R2 would change accordingly.

Although the illustrative embodiment of the invention has been described as having an effective resistance comprised of a switching transistor and a discrete resistance, both of which can be manufactured at various steps in the manufacture of an integrated circuit, the invention is not limited to having discrete resistances. The resistance can be the inherent impedance in a transistor, such as but not limited to CMOS N-channel and P-channel transistors. In such devices having inherent impedance, the on-resistance, or impedance, would replace the discrete resistance. Under these conditions, the circuit may be redefined to be more complex to assure that the voltage drops across two transistors operating as combined switches and resistances are known on an individual circuit basis in order to set the comparator threshold voltage. The voltage drops across two such transistors may not be equal because the on resistance of the two transistors may differ. The on resistance may differ due to process variations during manufacture of the transistors.

The invention claimed is:

1. An integrated circuit including a phase detection circuit, comprising:

an exclusive gate having first and second gate inputs for receiving first and second gate input signals, and a gate output providing a gate output signal that is the exclusive combination of the first and second gate input signals;

a first resistance coupled between a first voltage source and a common node;

a second effective resistance coupled between a second voltage source and the common node, the second effective resistance receiving the gate output signal to control the resistance thereof, the first and second resistance cooperating to develop a signal at the common node; and a comparator having first and second comparator inputs and a comparator output, the first comparator input coupled to the common node, the second comparator input coupled to a threshold value, the comparator output providing a signal that takes on a first value when the average value of the signal developed at the common node is greater than the threshold value, and a second value when the average value of the signal developed at the common node is less than the threshold value, whereby the comparator output signal is indicative of whether the first and second gate input signals to the exclusive gate are in phase.

2. An integrated circuit as recited in claim 1, wherein at least one of the first and second resistances comprises a switched resistance.

3. An integrated circuit as recited in claim 1, further comprising:

a charge storage device, the charge storage device coupled between the common node of the exclusive gate and one of said first and second voltage sources.

4. An integrated circuit as recited in claim 1, wherein the first effective resistance comprises a transistor.

5. An integrated circuit as recited in claim 4, wherein the first effective resistance further comprises a resistance in series with the transistor.

6. An integrated circuit as recited in claim 1, wherein the second effective resistance comprises a transistor.

7. An integrated circuit as recited in claim 4, wherein the second effective resistance comprises a transistor.

8. An integrated circuit as recited in claim 6, wherein the second effective resistance further comprises a resistance in series with the transistor.

9. An integrated as recited in claim 4, wherein the effective resistance of one of said first and second effective resistances has a magnitude that is controlled by the exclusive gate.

10. An integrated circuit including a frequency synthesizer for receiving a first signal at a first frequency and for generating a second signal at a second frequency, the frequency synthesizer comprising:

a phase detection circuit for receiving a first input signal indicative of the first signal of the frequency synthesizer, and for receiving a second input signal indicative of the second signal of the frequency synthesizer, the phase detection circuit comprising:

an exclusive gate having first and second gate inputs for receiving first and second gate input signals, and a gate output providing a gate output signal that is the exclusive combination of the first and second gate input signals, the first gate input signal being the first signal and the second gate input signal being the second signal;

a first effective resistance coupled between a first voltage source and a common node;

a second effective resistance coupled between a second voltage source and the common node, the second effective resistance receiving the gate output signal to control the effective resistance thereof, the first and second resistance cooperating to develop a signal at the common node; and a comparator having first and second comparator inputs and a comparator output, the first comparator input coupled to the common node, the second comparator input coupled to a threshold value, the comparator output providing a signal that takes on a first value when the average value of the signal developed at the common node is greater than the threshold value, and a second value when the average value of the signal developed at the common node is less than the threshold value, whereby the comparator output signal is indicative of whether the first and second input signals to the exclusive gate are in phase;

an oscillator control circuit for receiving the comparator output, and for providing an oscillator control signal in response to the comparator output; and an oscillator for receiving the oscillator control signal and for producing the second signal, the oscillator capable of adjusting the phase of the second signal in response to the control signal.

11. An integrated circuit as recited in claim 10, wherein at least one of the first effective resistance and second effective resistance comprises a switched resistance.

12. An integrated circuit as recited in claim 10, further comprising a divide-down counter, the divide down counter receiving the first signal and providing a divided-down version thereof as the first gate input signal.

13. An integrated circuit as recited in claim 10, further comprising a divide-down counter, the divide down counter receiving the second signal and providing a divided-down version thereof as the second gate input signal.

14. An integrated circuit as recited in claim 12, further comprising a second divide-down counter, the second divide down counter receiving the second signal and providing a divided-down version thereof as the second gate input signal.

15. An integrated circuit including a phase detection circuit, comprising:

an exclusive OR gate having first and second gate inputs for receiving first and second gate input signals, and a gate output providing a gate output signal that is the exclusive OR combination of the first and second gate input signals;

a first effective resistance coupled between a first voltage source and a common node;

a second effective resistance coupled between a second voltage source and the common node, the second effective resistance including a transistor, the transistor having a first terminal coupled to the second voltage source, a second terminal coupled to the common node, and a control terminal coupled to the gate output signal to control the effective resistance of the second effective resistance in response to the gate output signal, the first effective resistance and second effective resistance cooperating to develop a signal at the common node;

a comparator having a comparator input, a threshold input, and an output, the comparator input coupled to the common node and the threshold input coupled to a predetermined threshold value, the comparator output providing a signal that takes on a first value when the average value of the signal developed at the common node is greater than the predetermined threshold value, and a second value when the average value of the signal developed at the common node is less than the predetermined threshold value, whereby the comparator output signal is indicative of whether the first and second gate input signals to the exclusive OR gate are in phase.

* * * * *